(12) United States Patent
Tominaga et al.

(10) Patent No.: US 9,443,751 B2
(45) Date of Patent: Sep. 13, 2016

(54) BACK GRINDING SHEET

(71) Applicant: LINTEC CORPORATION, Itabashi-ku (JP)

(72) Inventors: Tomochika Tominaga, Saitama (JP); Kazuyuki Tamura, Phoenix, AZ (US)

(73) Assignee: LINTEC CORPORATION, Itabashi-ku (JP)

( * ) Notice: Subject to any disclaimer, the term of this patent is extended or adjusted under 35 U.S.C. 154(b) by 0 days.

(21) Appl. No.: 14/430,647

(22) PCT Filed: Sep. 17, 2013

(86) PCT No.: PCT/JP2013/075054
§ 371 (c)(1),
(2) Date: Mar. 24, 2015

(87) PCT Pub. No.: WO2014/046096
PCT Pub. Date: Mar. 27, 2014

(65) Prior Publication Data
US 2015/0255321 A1    Sep. 10, 2015

(30) Foreign Application Priority Data
Sep. 24, 2012 (JP) ................................. 2012-209961

(51) Int. Cl.
H01L 21/683 (2006.01)
C09D 133/14 (2006.01)
C09J 7/02 (2006.01)

(52) U.S. Cl.
CPC ......... *H01L 21/6836* (2013.01); *C09D 133/14* (2013.01); *C09J 7/02* (2013.01);
(Continued)

(58) Field of Classification Search
CPC .................................................. H01L 21/6836
See application file for complete search history.

(56) References Cited

U.S. PATENT DOCUMENTS 6,793,762 B1    9/2004 Kondo et al.
2005/0269717 A1    12/2005 Ohashi et al.
(Continued)

FOREIGN PATENT DOCUMENTS

JP    11 343469    12/1999
JP    2005 343997    12/2005
(Continued)

OTHER PUBLICATIONS

International Search Report Issued Dec. 3, 2013 in PCT/JP13/075054 filed Sep. 17, 2013.

*Primary Examiner* — Ian Rummel
(74) *Attorney, Agent, or Firm* — Oblon, McClelland, Maier & Neustadt, L.L.P.

(57) ABSTRACT

The present invention relates to a back grinding sheet (BG sheet) (1a, 1b, 1c) having an unevenness-absorbing layer (12) on a substrate (11), in which the unevenness-absorbing layer is a layer formed of a film-forming composition containing (A) a urethane (meth)acrylate and (B) a polymerizable monomer except component (A) and the layer satisfies the following requirements (a) to (c): (a) a loss tangent at 70° C. measured at a frequency of 1 Hz is 1.5 or more, (b) a relaxation rate 300 seconds after a square (1 cm×1 cm) of the unevenness-absorbing layer is compressed at 25° C. and a compressive load of 10 N is 30% or less, and (c) a storage elastic modulus at 25° C. measured at a frequency of 1 Hz is 1.0 to 10.0 MPa. The BG sheet of the present invention has excellent absorptivity of uneven portions such as bumps in a semiconductor wafer and can suppress formation of gaps between bumps and the BG sheet and simultaneously suppress a phenomenon where the resin layer (unevenness-absorbing layer) of a BG sheet oozes from the edges of a roll when the BG sheet is wound up in the form of roll.

8 Claims, 1 Drawing Sheet

(52) U.S. Cl.
CPC . *C09J 2433/001* (2013.01); *H01L 2221/6834* (2013.01); *H01L 2221/68327* (2013.01); *Y10T 428/24826* (2015.01); *Y10T 428/2848* (2015.01)

(56) References Cited

U.S. PATENT DOCUMENTS

2010/0255299 A1\* 10/2010 Kawashima ............ B32B 27/08
428/354

2011/0030882 A1\* 2/2011 Mizuno .................. C09J 7/0296
156/153

FOREIGN PATENT DOCUMENTS

| JP | 4603578 | 12/2010 |
| JP | 2013 169685 | 9/2013 |
| WO | 2012 128311 | 9/2012 |

\* cited by examiner (a)
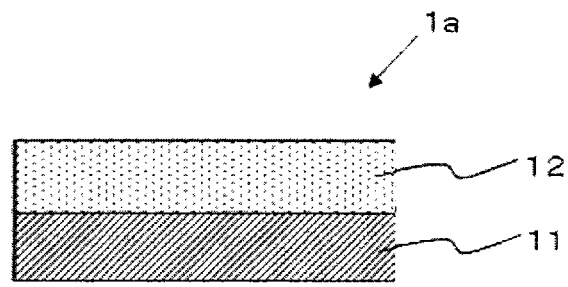
(b)
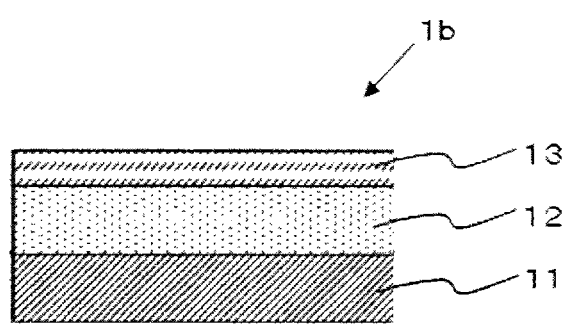
(c)
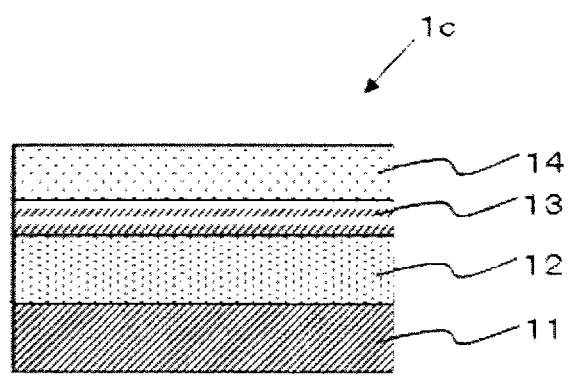

BACK GRINDING SHEET

CROSS-REFERENCE TO RELATED APPLICATIONS

This application is a National Stage of PCT/JP2013/075054, which was filed on Sep. 17, 2013. This application is based upon and claims the benefit of priority to Japanese Application No. 2012-209961, which was filed on Sep. 24, 2012.

TECHNICAL FIELD

The present invention relates to a back grinding sheet, more specifically, to a back grinding sheet suitable for use in protecting the surface of uneven portions such as bumps in grinding the back surface of a workpiece such as a semiconductor wafer having uneven portions such as bumps.

BACKGROUND ART

Reduction in thickness and size and multi-functionalization of information terminal devices have rapidly proceeded. In the circumstances, thinner and denser semiconductor devices, which are to be installed in the information terminal devices, are also required. For reducing thickness of the semiconductor devices, a semiconductor wafer on which semiconductors are to be mounted, is required to reduce thickness. To deal with the requirement, the back surface of a semiconductor wafer is ground to reduce thickness.

Recently, the back surface of a semiconductor wafer having uneven portions such as bumps (electrodes) of about 30 µm to 100 µm in height, formed of solder etc., has been occasionally ground. In grinding the back surface of such a semiconductor wafer having bumps, a back grinding sheet (hereinafter, referred to also as "BG sheet") is generally stuck for protecting the surface of the uneven portions such as bumps.

However, when a BG sheet generally used is stuck to a semiconductor wafer having bumps, the BG sheet on portions where bumps are present differs in height from that on portions where bumps are not present. As a result, it is difficult to obtain a flat surface of the wafer after the BG sheet is stuck. Because of the difference in height of the wafer surface, pressure is unevenly applied to the back surface of the wafer. As a result, when the back surface of the wafer is ground, dimples (chips, dints) and cracks (breakage) are produced. As the case may be, the semiconductor wafer is occasionally broken.

To overcome such a problem, for example, Patent document 1 discloses a surface protecting sheet for a semiconductor wafer, having a resin layer, which is adjusted to have storage elastic moduli at 25° C. and 60° C. within predetermined ranges. The surface protecting sheet for a semiconductor wafer overcomes the above problem by providing a resin layer having a difference in storage elastic modulus between room temperature (25° C.) and high temperature (60° C.), more specifically, by sticking the resin layer to uneven portions such as bumps of a wafer at a high temperature, thereby softening the resin layer, absorbing uneven portions such as bumps and reducing difference in height of the wafer surface.

PRIOR ART DOCUMENTS

Patent Documents

Patent document 1: Japanese Patent No. 4603578

SUMMARY OF THE INVENTION

Problems to be Solved by the Invention

However, uneven portions (bumps etc.) of a wafer were not sufficiently absorbed just by reducing the storage elastic modulus of a resin layer at a high temperature, as described in Patent document 1. Particularly, an effect of suppressing gaps formed between bumps and a BG sheet is insufficient. Thus, there is fear that water used in grinding the back surface of a wafer enters the gaps during a grinding process and contaminates uneven portions such as bumps in the wafer.

In addition, when the BG sheet is wound up in the form of roll, there occasionally occurs a phenomenon where the resin layer of the BG sheet oozes from the edges of the roll.

An object of the present invention is to provide a back grinding sheet having excellent absorptivity of uneven portions such as bumps of a semiconductor wafer and simultaneously capable of suppressing a phenomenon where the resin layer (unevenness-absorbing layer) of a BG sheet oozes from the edges of a roll when the BG sheet is wound up in the form of roll.

Means for Solving the Problems

The present inventors found out that the aforementioned problems can be solved by forming an unevenness-absorbing layer of a BG sheet from a film-forming composition containing predetermined components and adjusting it so as to satisfy predetermined requirements.

More specifically, the present invention provides the following [1] to [6].

[1] A back grinding sheet having an unevenness-absorbing layer on a substrate, wherein the unevenness-absorbing layer is a layer formed of a film-forming composition containing (A) a urethane (meth)acrylate and (B) a polymerizable monomer except the component (A), and the layer satisfies the following requirements (a) to (c):

(a) a loss tangent at 70° C. measured at a frequency of 1 Hz is 1.5 or more, (b) a relaxation rate 300 seconds after a square (1 cm×1 cm) of the unevenness-absorbing layer is compressed at 25° C. and a compressive load of 10N is 30% or less, and (c) a storage elastic modulus at 25° C. measured at a frequency of 1 Hz is 1.0 to 10.0 MPa.

[2] The back grinding sheet according to [1] above, in which the component (B) contains a (meth)acrylate having an alicyclic structure.

[3] The back grinding sheet according to [1] or [2] above, in which the component (A) contains a mono-functional urethane (meth)acrylate oligomer.

[4] The back grinding sheet according to any of [1] to [3] above, in which the film-forming composition further contains (C) a thiol group-containing compound.

[5] The back grinding sheet according to any of [1] to [4] above, further having a pressure sensitive adhesive layer on the unevenness-absorbing layer.

[6] The back grinding sheet according to any of [1] to [5] above, which is stuck to the uneven portions of a semiconductor wafer.

Effects by the Invention

Since the back grinding sheet (BG sheet) of the present invention has excellent absorptivity of uneven portions (bumps etc.) of a semiconductor wafer, the back grinding sheet can effectively suppress, in particular, formation of gaps between bumps and the BG sheet and simultaneously suppress a phenomenon where the resin layer (unevenness-absorbing layer) of a BG sheet oozes from the edges of a roll when the BG sheet is wound up in the form of roll.

BRIEF DESCRIPTION OF DRAWING

FIG. 1 shows sectional views of structures of the back grinding sheet of the present invention.

DESCRIPTION OF EMBODIMENTS

In the following description, "weight average molecular weight (Mw)" and "number average molecular weight (Mn)" are based on polystyrene equivalent values determined by gel permeation chromatography (GPC), more specifically, values determined based on the methods described in Examples.

In the specification, for example, "(meth)acrylate" is a term collectively referring to both "acrylate" and "methacrylate" and the same shall apply to other analogous terms.

[Structure of Back Grinding Sheet (BG Sheet)]

FIG. 1 shows sectional views of structures of the BG sheet of the present invention.

The BG sheet of the present invention is not particularly limited as long as it has an unevenness-absorbing layer 12 on a substrate 11, like BG sheet 1a shown in FIG. 1(a).

For example, the BG sheet may further have a pressure sensitive adhesive layer 13 on the unevenness-absorbing layer 12, like BG sheet 1b; and may further have a release material 14 on the pressure sensitive adhesive layer 13, like BG sheet 1c.

Like BG sheets 1b and 1c, if the pressure sensitive pressure sensitive adhesive layer 13 is provided, adhesiveness of the BG sheet to a protective object such as wafer can be easily adjusted. In addition, it is possible to prevent adhesion of residuals in the unevenness-absorbing layer from remaining on the surface of the protective object after the BG sheet is removed.

The thickness of the substrate 11 is preferably 5 to 250 μm, more preferably 10 to 200 μm and further preferably 25 to 150 μm, in order to apply appropriate elasticity to the BG sheet and in view of handling during roll-up time.

It is preferable that the thickness of the unevenness-absorbing layer 12 is appropriately adjusted depending upon the height of a protective object such as bumps, more specifically falls within a numerical range of preferably 50 to 1000 μm, more preferably 70 to 700 μm, and further preferably 100 to 500 μm. If the thickness of the unevenness-absorbing layer is 50 μm or more, ordinary bumps etc. can be protected. In contrast, if the thickness is 1000 μm or less, the degree of distortion of the BG sheet by bending can be reduced.

The thickness of the pressure sensitive adhesive layer 13 to be provided can be appropriately adjusted depending upon the height of a protective object such as bumps in the circuit surface, however, the thickness thereof is preferably 5 to 200 μm, more preferably 7 to 150 μm and further preferably 10 to 100 μm.

The thickness of the release material 14 is preferably 5 to 200 μm, more preferably 10 to 120 μm and further preferably 15 to 80 μm.

It is to be noted that the thicknesses of the substrate 11, unevenness-absorbing layer 12, pressure sensitive adhesive layer 13, release material 14 and others constituting a BG sheet are values determined in accordance with JIS K7130.

<Substrate>

The substrate to be used in the present invention is not particularly limited; however, it is preferably a resin film. A resin film is preferable because it produces less amount of dust compared to paper and nonwoven cloth substrates and thus suitable as a material to be processed into electronic parts and it is easily available.

If a substrate is provided to a BG sheet, shape stability of the BG sheet can be improved and appropriate stiffness can be given to the BG sheet. In addition, when the BG sheet is stuck to an uneven surface, the opposite surface of the BG sheet bonding to the bumpy surface is likely to be kept flat and smooth.

The substrate to be used in the present invention may be a substrate formed of a single-layer film formed of a single resin film or a substrate formed of a multilayer-film formed by laminating a plurality of resin films.

Examples of the resin film to be used as a substrate in the present invention include a polyolefin-based film, a vinyl halide polymer-based film, an acrylic resin-based film, a rubber-based film, a cellulose-based film, a polyester-based film, a polycarbonate-based film, a polystyrene-based film, a polyphenylene sulfide-based film, a cycloolefin polymer-based film and a film formed of a cured material of an energy beam curable composition containing a urethane resin.

Of them, a resin film selected from a polyester-based film, a polycarbonate-based film, a polystyrene-based film, a polyphenylene sulfide-based film, a cycloolefin polymer-based film and a film formed of a cured material of an energy beam curable composition containing a urethane resin is preferable, for the reason that a workpiece such as a wafer can be stably held when it is reduced in thickness to extremely thin by grinding and the accuracy in film thickness is high, and a polyester-based film is more preferable.

It is to be noted that when a film formed of a cured material of an energy beam curable composition containing a urethane resin is used, the storage elastic modulus of the film at 25° C. measured at a frequency of 1 Hz is preferably beyond 10.0 MPa and more preferably 15 MPa or more, in order to improve shape stability of a BG sheet and for the BG sheet to have appropriate elasticity.

It is to be noted that the storage elastic modulus of the film at 25° C. measured at a frequency of 1 Hz is the same as the storage elastic modulus of an unevenness-absorbing layer defined in requirement (c) and measured in the same manner.

Examples of a polyester constituting the polyester-based film include a polyester obtained by polycondensation of an aromatic dibasic acid or an ester derivative thereof and a diol or an ester derivative thereof.

Specific examples of the polyester-based film include films formed of polyesters such as poly(ethylene terephthalate), poly(ethylene isophthalate), poly(butylene terephthalate) and poly(ethylene-2,6-naphthalene dicarboxylate).

It is to be noted that the polyester film to be used in the present invention may be a film formed of a polyester copolymer or a film formed of a mixture of resins consisting of a polyester as mentioned above and a relatively small amount of another resin.

Of these polyester-based films, a poly(ethylene terephthalate) film is preferable since it is easily available and has high thickness accuracy.

It is to be noted that, in order to improve adhesiveness between a substrate and an unevenness-absorbing layer, a substrate formed by further laminating a primer layer or a pressure sensitive adhesive layer on the surface of a resin film may be used.

To the substrate to be used in the present invention, e.g., a filler, a coloring agent, an antistatic agent, an antioxidant, an organic lubricant and a catalyst may be added as long as the effects by the invention are not damaged.

The substrate may be acceptable if it is transparent or opaque, or optionally, if it is colored or vapor-deposited.

If a BG sheet has a pressure sensitive adhesive layer (described later) and the pressure sensitive adhesive constituting the pressure sensitive adhesive layer is an energy beam curable adhesive, the substrate preferably transmits the energy beam sufficient to cure the adhesive.

<Unevenness-Absorbing Layer>

The unevenness-absorbing layer constituting the BG sheet of the present invention is a layer formed of a film-forming composition containing (A) a urethane (meth) acrylate and (B) a polymerizable monomer except the component (A) and satisfying the following requirements (a) to (c):

(a) a loss tangent at 70° C. measured at a frequency of 1 Hz is 1.5 or more, (b) a relaxation rate 300 seconds after a square (1 cm×1 cm) of the unevenness-absorbing layer is compressed at 25° C. and a compressive load of 10N is 30% or less, and (c) a storage elastic modulus at 25° C. measured at a frequency of 1 Hz is 1.0 to 10.0 MPa.

It is to be noted that physical properties of the unevenness-absorbing layer defined in requirements (a) to (c) are values determined by the methods described in Examples.

If the requirement (a) is satisfied, the unevenness-absorbing layer is not only softened but also increased in flowability when a BG sheet is heated in order to bond the BG sheet to a workpiece such as a semiconductor wafer having uneven portions (bumps etc.). As a result, the resultant BG sheet is improved in absorptivity of uneven portions (bumps etc.) of a semiconductor wafer. Furthermore, when the BG sheet is stuck to the uneven portions of a semiconductor wafer, difference in height of the surface of the wafer can be reduced and formation of gaps between uneven portions (bumps etc.) and the BG sheet can be sufficiently prevented.

The loss tangent at 70° C. measured at a frequency of 1 Hz is 1.5 or more; however, the loss tangent is preferably 1.75 or more, more preferably 2.0 or more, further preferably 2.1 or more and further more preferably 2.2 or more, from the aforementioned points of view.

If the loss tangent at 70° C. is less than 1.5, the flowability of unevenness-absorbing layer becomes insufficient when a BG sheet is heated and absorptivity of uneven portions (bumps etc.) tends to decrease.

It is to be noted that the upper limit value of the loss tangent is not particularly limited; however, the loss tangent is preferably 5.0 or less, more preferably 4.4 or less and further preferably 4.0 or less.

If the requirement (b) is satisfied, deformation of the unevenness-absorbing layer in the planar direction can be suppressed when the BG sheet of the present invention is wound up in the form of roll and oozing in the unevenness-absorbing layer from the edges of the roll can be effectively suppressed.

It is to be noted that the "relaxation rate" referred to in the requirement (b) is a value obtained by compressing a square (1 cm×1 cm) of the unevenness-absorbing layer at 25° C. and a compressive load of 10N, measuring load value α (unit: N) attenuated after a lapse of 300 seconds and calculating by assigning the load value α to the following expression. Measurement is specifically performed based on the method described in Examples.

Relaxation rate (%)=(10−α)/10×100

The relaxation rate at 300 seconds after a square (1 cm×1 cm) of the unevenness-absorbing layer is compressed at 25° C. and a compressive load of 10 N is 30% or less; however, the relaxation rate is preferably 29% or less and more preferably 28% or less, from the aforementioned points of view.

If the relaxation rate exceeds 30%, the unevenness-absorbing layer deforms in the planar direction when a BG sheet is wound up in the form of roll, and oozing in the unevenness-absorbing layer from the edges of the roll sticks out. For the reason, the relaxation rate beyond 30% is not preferable.

It is to be noted that the lower limit value of the relaxation rate is not particularly limited; however, the relaxation rate is preferably 1% or more, and more preferably 11% or more.

If the requirement (c) is satisfied, oozing in the unevenness-absorbing layer from the edges of the roll when a BG sheet of the present invention is wound up in the form of roll, can be effectively suppressed and absorptivity of uneven portions (bumps etc.) can be improved.

The storage elastic modulus at 25° C. measured at a frequency of 1 Hz is 1.0 to 10.0 MPa; however, the storage elastic modulus is preferably 1.1 to 9.0 MPa, more preferably 1.2 to 8.0 MPa and further preferably 1.3 to 7.0 MPa, from the aforementioned points of view.

If the storage elastic modulus at 25° C. is less than 1.0 MPa, the unevenness-absorbing layer deforms in the planar direction when a BG sheet is wound up in the form of roll and oozing in the unevenness-absorbing layer sticks out. For the reason, the storage elastic modulus at 25° C. of less than 1.0 MPa is not preferable.

In contrast, if the storage elastic modulus exceeds 10.0 MPa, flexibility of the unevenness-absorbing layer decreases and absorptivity of uneven portions (bumps etc.) deteriorates.

It is preferable that a film-forming composition constituting an unevenness-absorbing layer further contains (C) a thiol group-containing compound in order that the unevenness-absorbing layer to be formed is adjusted to satisfy the above requirement (a).

To the film-forming composition, (D) a photopolymerization initiator and other additives such as an antioxidant, a softener (a plasticizer), a filler, a rust preventing agent, a pigment and a dye may be added.

Hereinafter, the components to be contained in a film-forming composition will be more specifically described.

[Component (A): Urethane (Meth)Acrylate]

The film-forming composition to be used in the present invention contains a urethane (meth)acrylate serving as the component (A).

The urethane (meth)acrylate is a compound at least having a (meth)acryloyl group and a urethane bond and capable of being cured by polymerization upon energy beam irradiation.

The number of (meth)acryloyl groups (hereinafter, referred to also as a "functional-group number") in the urethane (meth)acrylate may be one, two or three or more. However, in order to form an unevenness-absorbing layer satisfying the above requirements (a) to (c), a mono-functional urethane (meth)acrylate is preferably contained and a mixture of a mono-functional urethane (meth)acrylate and a bifunctional urethane (meth)acrylate is more preferably contained.

If the mono-functional urethane (meth)acrylate is contained in a film-forming composition, the mono-functional urethane (meth)acrylate is not participated in formation of a three-dimensional network structure of a polymerization structure, the three-dimensional network structure is not easily formed, with the result that an unevenness-absorbing layer satisfying the above requirements (a) to (c) [particularly, an unevenness-absorbing layer satisfying above requirement (b)] is easily formed.

A urethane (meth)acrylate can be obtained by reacting a (meth)acrylate having a hydroxyl group with an isocyanate-terminated urethane prepolymer, which is obtained by reacting, for example, a polyol compound and a polyvalent isocyanate compound.

It is to be noted that a single urethane (meth)acrylate or a combination thereof may be used.

(Polyol Compound)

The polyol compound is not particularly limited as long as it is a compound having two or more hydroxyl groups.

Specific examples of the polyol compound include an alkylene diol, a polyether type polyol, a polyester type polyol and a polycarbonate type polyol.

Of them, a polyether type polyol is preferable.

It is to be noted that the polyol compound may be a bifunctional diol, a trifunctional triol or a tetrafunctional polyol or more; however, in order to form an unevenness-absorbing layer satisfying the above requirements (a) to (c), a bifunctional diol is preferable and a polyether type diol is more preferable.

The molecular weight calculated based on the hydroxyl value of a polyol compound is preferably 1,000 to 10,000, more preferably 2,000 to 9,000 and further preferably 3,000 to 7,000. If the molecular weight is 1,000 or more, a case where a urethane bond is excessively formed so that viscoelasticity of an unevenness-absorbing layer becomes hardly controlled is avoided. For the reason, the molecular weight of 1,000 or more is preferable. In contrast, if the molecular weight is 10,000 or less, it is possible to prevent a case where the resultant unevenness-absorbing layer is excessively softened. For the reason, the molecular weight of 10,000 or less is preferable.

It is to be noted that the molecular weight calculated based on the hydroxyl value of a polyol compound is a value obtained from the expression:

[The number of functional groups of polyether type polyol]×56.11×1000/[hydroxyl value (unit: mg KOH/g)].

The polyether type diol is preferably a compound represented by the following formula (1).

$$\text{HO} \!\!-\!\!(\text{RO})_{\overline{n}}\!\!-\!\!\text{H} \tag{1}$$

In the above formula (1), R represents a divalent hydrocarbon group, preferably an alkylene group and more preferably an alkylene group having 1 to 6 carbon atoms. Of the alkylene groups having 1 to 6 carbon atoms, an ethylene group, a propylene group and a tetramethylene group are preferable, and a propylene group and a tetramethylene group are more preferable.

Furthermore, "n", which represents the number of repeat units of an alkylene oxide, is 10 to 250, preferably 25 to 205 and more preferably 40 to 185. If "n" falls within the above range, the resultant urethane (meth)acrylate has a urethane bond in an appropriate concentration and the relaxation rate of an unevenness-absorbing layer can be easily adjusted so as to satisfy particularly the above requirement (b).

Of the compounds represented by the above formula (1), polyethylene glycol, polypropylene glycol and polytetramethylene glycol are preferable, and polypropylene glycol and polytetramethylene glycol are more preferable.

A polyether type diol reacts with a polyvalent isocyanate compound to produce an isocyanate-terminated urethane prepolymer having an ether bond moiety [-(—R—O-)n-] introduced therein. If such a polyether type diol is used, a urethane (meth)acrylate contains a constitutional unit derived from the polyether type diol.

As a polybasic acid component to be used for producing a polyester type polyol, a compound generally known as a polybasic acid component for a polyester can be used.

Specific examples of the polybasic acid component include dibasic acids such as adipic acid, maleic acid, succinic acid, oxalic acid, fumaric acid, malonic acid, glutaric acid, pimelic acid, azelaic acid, sebacic acid and suberic acid; aromatic polybasic acids including dibasic acids such as phthalic acid, isophthalic acid, terephthalic acid and 2,6-naphthalene dicarboxylic acid, and polybasic acids such as trimellitic acid and pyromellitic acid; and anhydrides corresponding to these and derivatives thereof, and dimer acids and hydrogenated dimer acids.

Of them, an aromatic polybasic acid is preferable in order to form a coating film having an appropriate hardness.

In an esterification reaction for producing a polyester type polyol, various types of catalysts known in the art may be optionally used.

Examples of the catalyst include tin compounds such as dibutyltin oxide and tin(II) octylate; and an alkoxy-titanium such as tetrabutyl titanate and tetrapropyl titanate.

(Polyvalent Isocyanate Compound)

Examples of the polyvalent isocyanate compound include aliphatic polyisocyanates such as tetramethylene diisocyanate, hexamethylene diisocyanate and trimethylhexamethylene diisocyanate; alicyclic diisocyanates such as isophorone diisocyanate, norbornane diisocyanate, dicyclohexylmethane-4,4'-diisocyanate, dicyclohexylmethane-2,4'-diisocyanate and ω,ω'-diisocyanatedimethyl cyclohexane; and aromatic diisocyanates such as 4,4'-diphenylmethane diisocyanate, tolylene diisocyanate, xylylene diisocyanate, tolidine diisocyanate, tetramethylenexylylene diisocyanate and naphthalene-1,5-diisocyanate.

Of them, isophorone diisocyanate, hexamethylene diisocyanate and xylylene diisocyanate are preferable in view of handling.

[(Meth)Acrylate Having a Hydroxyl Group]

If a (meth)acrylate having a hydroxyl group is reacted with an isocyanate-terminated urethane prepolymer, which is obtained by reacting a polyol compound as mentioned above and a polyvalent isocyanate compound, a urethane (meth)acrylate can be obtained.

The (meth)acrylate having a hydroxyl group is not particularly limited, as long as it is a compound at least having a hydroxyl group and a (meth)acryloyl group in a molecule.

Specific examples of the (meth)acrylate having a hydroxyl group include hydroxyalkyl (meth)acrylates such as 2-hydroxyethyl (meth)acrylate, 2-hydroxypropyl (meth)acrylate, 4-hydroxybutyl (meth)acrylate, 4-hydroxycyclohexyl (meth)acrylate, 5-hydroxycyclooctyl (meth)acrylate, 2-hydroxy-3-phenyloxypropyl (meth)acrylate, pentaerythritol tri(meth)acrylate, polyethylene glycol mono(meth)acrylate and polypropylene glycol mono(meth)acrylate; hydroxyl group-containing (meth)acrylamides such as N-methylol (meth)acrylamide; and reaction products obtained by reacting a (meth)acrylic acid with vinyl alcohol, vinylphenol and a diglycidyl ester of bisphenol A.

Of them, hydroxyalkyl (meth)acrylate is preferable and 2-hydroxyethyl (meth)acrylate is more preferable.

An isocyanate-terminated urethane prepolymer is preferably reacted with a (meth)acrylate having a hydroxyl group in the presence of a catalyst in the condition of 60 to 100° C. for 1 to 4 hours, by optionally adding a solvent.

A urethane (meth)acrylate thus obtained may be an oligomer, a polymer or a mixture thereof; however, the urethane (meth)acrylate oligomer is preferred.

The weight average molecular weight of the urethane (meth)acrylate is preferably 1,000 to 100,000, more preferably 3,000 to 80,000 and further preferably 5,000 to 65,000. If the weight average molecular weight is 1,000 or more, in a polymer obtained from a urethane (meth)acrylate (A) and a polymerizable monomer (B), structures derived from urethane (meth)acrylate (A) act with each other to produce intermolecular force, due to which the unevenness-absorbing layer becomes appropriately hard. For the reason, the weight average molecular weight of 1,000 or more is preferable.

The content of a component (A) in a film-forming composition is preferably 20 to 70% by mass, more preferably 25 to 60% by mass, further preferably 30 to 50% by mass and further more preferably 33 to 47% by mass.

[Component (B): Polymerizable Monomer Except Component (A)]

The film-forming composition to be used in the present invention contains a polymerizable monomer except component (A) as a component (B) in order to improve film formability.

In the present invention, a polymerizable monomer serving as a component (B) is a polymerizable compound except a urethane (meth)acrylate serving as a component (A) and a compound polymerizable with another component upon irradiation of an energy beam except a resin component having a weight average molecular weight of 1000 or more.

As the component (B), a compound having at least one (meth)acryloyl group is preferable.

It is to be noted that in the present invention, the "resin component" refers to an oligomer or a polymer compound having a repeating unit in the structure and a weight average molecular weight of 1,000 or more.

The molecular weight (formula weight) of a polymerizable monomer serving as the component (B) is preferably 70 to 900, more preferably 80 to 700, further preferably 90 to 500 and further more preferably 100 to 400.

Examples of the polymerizable monomer serving as a component (B) include (meth)acrylates having an alkyl group of 1 to 30 carbon atoms; (meth)acrylates having a functional group such as a hydroxyl group, an amide group, an amino group and an epoxy group; (meth)acrylates having an alicyclic structure; (meth)acrylates having an aromatic structure; (meth)acrylates having a heterocyclic structure; and vinyl compounds such as styrene, hydroxyethyl vinyl ether, hydroxybutyl vinyl ether, N-vinylformamide, N-vinylpyrrolidone and N-vinylcaprolactam.

Examples of the (meth)acrylate having an alkyl group of 1 to 30 carbon atoms include methyl (meth)acrylate, ethyl (meth)acrylate, n-propyl (meth)acrylate, isopropyl (meth)acrylate, n-butyl(meth)acrylate, isobutyl (meth)acrylate, t-butyl (meth)acrylate, n-pentyl (meth)acrylate, n-hexyl (meth)acrylate, 2-ethylhexyl (meth)acrylate, n-octyl (meth)acrylate, nonyl (meth)acrylate, decyl (meth)acrylate, undecyl (meth)acrylate, dodecyl (meth)acrylate, tridecyl (meth)acrylate, tetradecyl (meth)acrylate, hexadecyl (meth)acrylate, octadecyl (meth)acrylate and eicosyl (meth)acrylate.

Examples of the (meth)acrylate having a functional group include hydroxyl group-containing (meth)acrylates such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate and 4-hydroxybutyl (meth)acrylate; amide group-containing compounds such as (meth)acrylamide, N,N-dimethyl (meth)acrylamide, N-butyl (meth)acrylamide, N-methylol (meth)acrylamide, N-methylolpropane (meth)acrylamide, N-methoxymethyl (meth)acrylamide and N-butoxymethyl (meth)acrylamide; amino group-containing (meth)acrylates such as a primary amino group-containing (meth)acrylate, secondary amino group-containing (meth)acrylate and a tertiary amino group-containing (meth)acrylate; and epoxy group-containing (meth)acrylates such as glycidyl (meth)acrylate, a methylglycidyl (meth)acrylate and an allylglycidyl ether.

Examples of the (meth)acrylate having an alicyclic structure include isobornyl (meth)acrylate, dicyclopentenyl (meth)acrylate, dicyclopentanyl (meth)acrylate, dicyclopentenyloxy (meth)acrylate, cyclohexyl (meth)acrylate and adamantane (meth)acrylate.

Examples of the (meth)acrylate having an aromatic structure include phenylhydroxypropyl (meth)acrylate, benzyl (meth)acrylate, and 2-hydroxy-3-phenoxypropyl (meth)acrylate.

Examples of the (meth)acrylate having a heterocyclic structure include tetrahydrofurfuryl (meth)acrylate and morpholine acrylate.

Of them, a (meth)acrylate having an alicyclic structure is preferably contained as a component (B) in order to obtain a film-forming composition which easily forms an unevenness-absorbing layer satisfying the above requirement (b), and isobornyl (meth)acrylate is more preferably contained.

The content of (meth)acrylate having an alicyclic structure in a film-forming composition is preferably 32 to 53% by mass, more preferably 35 to 51% by mass, further preferably 37 to 48% by mass and further more preferably 40 to 47% by mass from the aforementioned points of view.

The content of (meth)acrylate having an alicyclic structure relative to the total amount of the component (B) contained in a film-forming composition is preferably 52 to 87% by mass, more preferably 55 to 85% by mass, further preferably 60 to 80% by mass and further more preferably 65 to 77% by mass, from the aforementioned points of view.

The content of the component (B) in a film-forming composition is preferably 30 to 80% by mass, more preferably 40 to 75% by mass, further preferably 50 to 70% by mass and further more preferably 53 to 67% by mass.

The mass ratio of a component (A) to a component (B), i.e., [component (A)/component (B)] in a film-forming composition is preferably 20/80 to 60/40, more preferably 30/70 to 50/50 and further preferably 35/65 to 45/55.

[Component (C): Thiol Group-Containing Compound]

It is preferable that the film-forming composition to be used in the present invention further contains a thiol group-containing compound as a component (C), in order to easily form an unevenness-absorbing layer satisfying the above requirement (a).

The thiol group-containing compound is not particularly limited as long as it is a compound having at least one thiol group in a molecule; however, it is preferably a multifunctional thiol group-containing compound and more preferably, a tetra-functional thiol group-containing compound from the aforementioned points of view.

Specific examples of the thiol group-containing compound include nonylmercaptan, 1-dodecanethiol, 1,2-ethanedithiol, 1,3-propanedithiol, triazinethiol, triazinedithiol, triazinetrithiol, 1,2,3-propanetrithiol, tetraethylene glycol-bis (3-mercaptopropionate), trimethylolpropane tris(3-mercaptopropionate), pentaerythritol tetrakis(3-mercaptopropionate), pentaerythritol tetrakis thioglucorate, dipentaerythritol hexakis(3-mercaptopropionate), tris [(3- mercaptopropionyloxy)-ethyl]-isocyanurate, 1,4-bis(3-mercaptobutyryloxy)butane, pentaerythritol tetrakis(3-mercaptobutyrate) and 1,3,5-tris(3-mercaptobutyloxyethyl)-1,3,5-triazine-2,4,6-(1H,3H,5H)-trione, etc.

It is to be noted that these thiol group-containing compounds may be used alone or in combinations of two or more.

The molecular weight (formula amount) of a thiol group-containing compound is preferably 200 to 3000 and more preferably 300 to 2000. If the molecular weight falls within the above range, compatibility of the thiol group-containing compound with a component (A) becomes satisfactory and satisfactory film formability can be obtained.

The content of a component (C) relative to the total (100 parts by mass) of a component (A) and a component (B) is preferably 1.0 to 4.9 parts by mass, more preferably 1.5 to 4.8 parts by mass, more preferably 1.75 to 4.75 parts by mass, further preferably 2.0 to 4.7 parts by mass and further more preferably 2.4 to 4.6 parts by mass.

If the content is 1.0 or more, an unevenness-absorbing layer satisfying the above requirement (a) is easily formed and absorptivity of uneven portions (bumps etc.) can be improved. In contrast, if the content is 4.9 parts by mass or less, an unevenness-absorbing layer satisfying the above requirements (b) and (c) is easily formed and oozing in an unevenness-absorbing layer when being wound up in the form of roll can be effectively suppressed.

[(D) Photopolymerization Initiator]

When an unevenness-absorbing layer is formed by curing a coating film formed of a film-forming composition by using e.g., an energy beam such as ultraviolet rays, the film-forming composition preferably further contains a photopolymerization initiator as a component (D).

Examples of the photopolymerization initiator include photopolymerization initiators such as a benzoin compound, an acetophenone compound, an acylphosphine oxide compound, a titanocene compound, a thioxanthone compound and a peroxide compound; and photosensitizers such as an amine and a quinone. More specific examples thereof include 1-hydroxycyclohexyl phenyl ketone, 2-hydroxy-2-methyl-1-phenyl-propan-1-on, benzoin, benzoin methyl ether, benzoin ethyl ether and benzoin isopropyl ether.

These photopolymerization initiators can be used alone or in combinations of two or more.

The content of the component (D) relative to the total (100 parts by mass) of a component (A) and a component (B) is preferably 0.05 to 15 parts by mass, more preferably 0.1 to 10 parts by mass and further preferably 0.3 to 5 parts by mass.

[Other Additives]

To a film-forming composition, other additives may be added as long as the effects by the invention are not damaged.

Examples of the other additives include an antioxidant, a softener (a plasticizer), a filler, a rust preventing agent, a pigment and a dye.

When these additives are blended, the content of other additives relative to the total (100 parts by mass) of a component (A) and a component (B) is preferably 0.01 to 6 parts by mass and more preferably 0.1 to 3 parts by mass.

It is to be noted that a film-forming composition may contain a resin component except a component (A), as long as the effects by the invention are not damaged; however, it is preferable that a component (A) alone is contained as a resin component.

The content of the resin component except a component (A) contained in a film-forming composition is preferably 5% by mass or less, more preferably 1% by mass or less, further preferably 0.1% by mass or less and further more preferably substantially 0% by mass or less.

<Pressure Sensitive Adhesive Layer>

The BG sheet of the present invention may further have a pressure sensitive adhesive layer formed on an unevenness-absorbing layer.

In the pressure sensitive adhesive layer, the type of adhesive constituting the pressure sensitive adhesive layer is not limited as long as it has appropriate removability from a workpiece such as a semiconductor wafer, to which the pressure sensitive adhesive layer is stuck.

Examples of such an adhesive include a rubber-based pressure sensitive adhesive, an acryl-based pressure sensitive adhesive, a silicone-based pressure sensitive adhesive and a polyvinylether-based pressure sensitive adhesive.

An energy beam curable-based pressure sensitive adhesive, which is cured by irradiation of an energy beam to acquire removability, a heat-bubbling type and a water-swelling type pressure sensitive adhesive can also be used.

Examples of the energy beam curable type pressure sensitive adhesive include the adhesives described in JP Nos. 60-196956 A and 60-223139 A. Of the energy beam curable type pressure sensitive adhesives, an ultraviolet ray curable pressure sensitive adhesive is preferable.

Examples of the water-swelling type pressure sensitive adhesive include the pressure sensitive adhesives described in JP Nos. 5-77284 B and 6-101455 B.

<Release Material>

When the BG sheet of the present invention has a pressure sensitive adhesive layer as a constituent, a release material may be further present on the pressure sensitive adhesive layer.

As the release material, there are used a release sheet in which both surfaces are treated to be releasable and a release sheet in which one surface is treated to be releasable, etc. For example, there is exemplified a substrate for a release material on which a release agent is applied.

Examples of the substrate for a release material include plastic films including films formed of a polyester resin such as a polyethylene terephthalate resin, a polybutylene terephthalate resin and a polyethylene-naphthalate resin; and films formed of a polyolefin resin such as a polypropylene resin and a polyethylene resin.

Examples of the release agent include rubber-based elastomers such as a silicone-based resin, an olefin-based resin, an isoprene-based resin and a butadiene resin; a long-chain alkyl-based resin, an alkyd-based resin and a fluorine-based resin, etc.

[Method for Manufacturing Back Grinding Sheet]

A method for manufacturing the BG sheet of the present invention is not particularly limited, and a manufacturing method known in the art can be used.

Examples of a method for manufacturing a BG sheet 1a having an unevenness-absorbing layer 12 formed on a substrate 11, as shown in FIG. 1 (a), include a method of manufacturing the BG sheet 1a by directly applying a solution of a film-forming composition to one of the surfaces of the substrate 11 to form a coating film and curing the coating film to form the unevenness-absorbing layer 12; and a method of manufacturing the BG sheet 1a by directly applying a solution of a film-forming composition to the surface of a release material treated with a release agent to form a coating film, subjecting the coating film to a semi-curing treatment to form a semi-cured layer on the release material, sticking the semi-cured layer and the substrate 11, and completely curing the semi-cured layer before or after the release material is removed to form the unevenness-absorbing layer 12.

Examples of a method for manufacturing a BG sheet 1b having a pressure sensitive adhesive layer 13, as shown in FIG. 1 (b) include a method of manufacturing the BG sheet 1b by directly applying a solution of an adhesive composition onto an unevenness-absorbing layer 12 of the BG sheet 1a, which is manufactured by the aforementioned method, followed by drying to form the pressure sensitive adhesive layer 13; and a method of manufacturing the BG sheet 1b by directly applying a solution of an adhesive composition to the surface of a release material 14 treated with a release agent, followed by drying to form the pressure sensitive adhesive layer 13 on the release material 14, sticking the pressure sensitive adhesive layer 13 and the unevenness-absorbing layer 12 to once manufacture a BG sheet 1c, and then removing the release material 14.

When the unevenness-absorbing layer 12 and the pressure sensitive adhesive layer 13 are formed, an organic solvent may further be added to a film-forming composition or a pressure sensitive adhesive composition to obtain a solution of the film-forming composition or the pressure sensitive adhesive composition.

Examples of the organic solvent to be used include methyl ethyl ketone, acetone, ethyl acetate, tetrahydrofuran, dioxane, cyclohexane, n-hexane, toluene, xylene, n-propanol and isopropanol, etc.

It is to be noted that as these organic solvents, organic solvents used in synthesizing components contained in a film-forming composition or a pressure sensitive adhesive composition may be used as they are. Other than these, one or more organic solvents may be added.

However, if at least one of a component (A) and a component (B) is a compound present in a liquid state at 25° C., it is not necessary to add an organic solvent. When an organic solvent is not used, a drying step is not required. For the reason, for improving productivity, an organic solvent is preferably not used.

The solution of a film-forming composition or a pressure sensitive adhesive composition can be applied to a substrate or a release material by a coating method known in the art to form a coating film.

Examples of the coating method include a spin coating method, a spray coating method, a bar coating method, a knife coating method, a roll coating method, a blade coating method, a die coating method and a gravure coating method, etc.

When the solution of a film-forming composition or a pressure sensitive adhesive composition contains an organic solvent, it is preferable that the solution is applied to a substrate, followed by drying it by heating at a temperature of 80 to 150° C. for 30 seconds to 5 minutes.

A film-forming composition is applied to a substrate to form a coating film, which is then subjected to a curing treatment. The curing treatment is preferably performed by a method for curing the formed coating film through polymerization by irradiation with an energy beam such as ultraviolet rays. The coating film may be completely cured by a single application process or a plurality of application processes.

Examples of the energy beam include ultraviolet rays and electron beams; however, ultraviolet rays are preferable.

The irradiation amount of energy beam is appropriately changed depending upon the type of energy beam. For example, when ultraviolet rays are used, the illuminance of the ultraviolet rays irradiated is preferably 50 to 500 mW/cm$^2$, more preferably 100 to 340 mW/cm$^2$ and the irradiation amount of ultraviolet rays is preferably 100 to 2500 mJ/cm$^2$ and more preferably 150 to 2000 J/cm$^2$.

EXAMPLES

The weight average molecular weights (Mw) of components used and compounds produced in the following Production Examples were measured by the following method:
<Weight Average Molecular Weight (Mw)>
Weight average molecular weight (Mw) was determined by use of gel permeation chromatography apparatus (product name "HLC-8020", manufactured by TOSOH CORPORATION) in the following conditions and a polystyrene equivalent (based on standard polystyrene) of the determined value was obtained and put in use.
(Measurement Conditions)
  Column: "TSK guard column HXL-H", "TSK gel GMHXL (×2)" and "TSK gel G2000HXL" (all are manufactured by TOSOH CORPORATION)
  Column temperature: 40° C.
  Developing solvent: tetrahydrofuran
  Flow rate: 1.0 mL/min BG sheets manufactured in Examples and Comparative Examples were measured and evaluated for physical properties based on the following methods.
(Loss Tangent of Unevenness-Absorbing Layer at 70° C. Measured at a Frequency of 1 Hz)

In a process for manufacturing BG sheet of each of Examples and Comparative Examples, a semi-cured layer was formed on a release film. The semi-cured layer was laminated on same type of release film. Ultraviolet rays was further irradiated from the side of the laminated release film four times [the same ultraviolet irradiation apparatus and ultraviolet ray source were used in Examples and Comparative Examples; the irradiation conditions are: height of a lamp: 150 mm, power of the lamp: 3 kW (power converted: 120 mW/cm), illuminance at wavelength of the light beam of 365 nm: 271 mW/cm$^2$, irradiation amount: 1200 mJ/cm$^2$ (measured by ultraviolet ray quantity meter "UV-351" manufactured by ORC MANUFACTURING CO., LTD.)] to completely cure the semi-cured layer. In this manner, there was formed a single-layer unevenness-absorbing layer of 150 µm in thickness sandwiched by two release films.

It is to be noted that, in Comparative Example 1, a single-layer unevenness-absorbing layer was obtained by separating it from a BG sheet.

These unevenness-absorbing layers were repeatedly laminated up to a thickness within the range of 1 to 2 mm to obtain a laminate of an unevenness-absorbing layer. Using the obtained laminate of unevenness-absorbing layer and a rheometer (product name "ARES" (twist-sheering system) manufactured by Rheometric), storage elastic modulus and loss elastic modulus of −20 to 120° C. were determined at a frequency of 1 Hz (6.28 rad/sec) and the loss tangent at 70° C. was calculated.
(Relaxation Rate at 300 Seconds after Unevenness-Absorbing Layer (in a Square of 1 cm×1 cm) is Compressed at 25° C. and a Compressive Load of 10N)

A laminate consisting of an unevenness-absorbing layer formed on a substrate and obtained in a process of manufacturing a BG sheet of each of Examples and Comparative Examples (a laminate of Comparative Example 1 was obtained by removing a pressure sensitive adhesive layer from a BG sheet) was cut into square (1 cm×1 cm) pieces. To the square pieces of the laminate, wafer tips (the same shape as that of the laminate pieces) were stuck to prepare test samples.

Subsequently, each of the test samples prepared above was mounted on the lower jig of a material-strength tester (product name: "INSTRON Type 5581", manufactured by Instron) such that the substrate faced the bottom of the lower jig. The test sample was compressed by applying a force of 10N by the upper jig. After attenuated for 300 seconds, load value α (unit: N) was measured. A relaxation rate was obtained by assigning the load value α to the computation expression:

"Relaxation rate (%)=[(10−α)/10]×100".

(Storage Elastic Modulus of Unevenness-Absorbing Layer at 25° C. Measured at a Frequency of 1 Hz)

In order to obtain the loss tangent of an unevenness-absorbing layer at 70° C., storage elastic modulus was measured at a frequency of 1 Hz within a temperature range of −20 to 120° C. From the measurement results, the storage elastic modulus at 25° C. was obtained.

(Difference in Height)

To a wafer with bumps of 80 μm in height, a BG sheet manufactured in each of Examples and Comparative Examples was stuck by using a re-laminator apparatus "RAD3510" (product name), manufactured by LINTEC Corporation.

Immediately after having been stuck, the total thickness "A" of a portion having a bump (the distance from the back surface of a wafer to the substrate-film surface of a BG sheet) and the total thickness "B" of a portion having no bump were measured by a constant-pressure thickness measuring apparatus "PG-02" (product name) manufactured by TECHLOCK Corporation. A value of "A minus B" was calculated and specified as the difference in height. The smaller value of the difference in height means that unevenness caused by the height of bumps is relaxed by the presence of the BG sheet.

[Absorptivity of Uneven Portions (Bumps Etc.)]

A BG sheet manufactured in each of Examples and Comparative Examples was stuck to a wafer with bumps in the same manner as in the time of evaluation of difference in height. Thereafter, the diameters of circular gaps produced around bumps were measured from the substrate side by using a digital optical microscope. The smaller diameter of gaps means that the BG sheet has high absorption performance of uneven portions (bumps etc.). Based on the following criteria, whether absorptivity of uneven portions (bumps etc.) was acceptable or unacceptable (fault) was evaluated.

A: Diameter of gaps is less than 150 μm.

F: Diameter of gaps is 150 μm or more.

(Presence or Absence of Oozing in Unevenness-Absorbing Layer when being Wound Up in the Form of Roll)

A BG sheet stuck to a release film 2 and manufactured in each of Examples and Comparative Examples described later was wound up around a core (3 inches in diameter) to form a roll, which was allowed to stand still in the environment of 23° C. and 50% RH (relative humidity) for a week. After the standstill, the presence or absence of oozing in the unevenness-absorbing layer from the side of the roll was evaluated by using a digital optical microscope (magnification: 100 times) based on the following criteria.

It is to be noted that since the BG sheet of Comparative Example 1 failed to be wound up in the form of roll in the same conditions as in Examples, evaluation was not made.

A: oozing in unevenness-absorbing layer was not observed at all.

B: oozing in unevenness-absorbing layer was partially observed.

C: oozing in unevenness-absorbing layer was highly noticeable.

Production Example 1

(Manufacture of Pressure Sensitive Adhesive Sheet)

Butyl acrylate (89 parts by mass), methyl methacrylate (5 parts by mass) and 2-hydroxyethyl acrylate (6 parts by mass) were subjected to solution polymerization performed in an ethyl acetate used as a solvent to obtain a solution of an acrylic copolymer having a weight average molecular weight (Mw) of 500,000 and a glass transition temperature of −47.2° C.

To the acrylic copolymer solution, (methacryloyloxy) ethyl isocyanate [5 parts by mass (solid-content ratio) relative to 100 parts by weight of the acrylic copolymer, 50 equivalents relative to 100 equivalents of hydroxyl groups in the acrylic copolymer] was added and it was reacted to obtain an ethyl acetate solution (solid-content concentration: 30% by mass) of an ultraviolet ray curable type acrylic copolymer having a polymerizable double bond in a molecule.

Furthermore, 2.7 parts by mass (solid-content ratio to 100 parts by mass of the ultraviolet ray curable acrylic copolymer) of a crosslinking agent, i.e., a polyvalent isocyanate compound (product name "BHS8515", manufactured by TOYOCHEM CO., LTD.) and 0.2 part by mass (solid-content ratio) of a photopolymerization initiator (product name: "Darocur TPO", manufactured by BASF), i.e., diphenyl (2,4,6-trimethylbenzoyl) phosphine oxide were mixed with the solution obtained above to prepare a solution of an ultraviolet ray curable type pressure sensitive adhesive composition.

Subsequently, the solution of an ultraviolet ray curable type pressure sensitive adhesive composition thus prepared was applied to a release film (SP-PET381031, manufactured by LINTEC Corporation, hereinafter referred to also as "release film 2") and dried to form a pressure sensitive adhesive layer of 10 μm in thickness. In this manner, a pressure sensitive adhesive sheet was manufactured.

Example 1

There were blended a mixture [40 parts by mass (solid-content ratio)] of a mono-functional urethane methacrylate and a bifunctional urethane methacrylate, serving as a component (A), isobornyl acrylate [IBXA, 45 parts by mass (solid-content ratio)] and a hydroxypropyl acrylate [HPA, 15 parts by mass (solid-content ratio)] serving as a component (B), 3.5 parts by mass (solid-content ratio) of pentaerythritol tetrakis(3-mercaptobutyrate) [product name "Karenz MT (registered trade mark) PE1", manufactured by Showa Denko K.K., secondary tetrafunctional thiol-containing compound, solid-content concentration: 100% by mass] serving as a component (C), and of 2-hydroxy-2-methyl-1-phenyl-propan-1-on [1 part by mass (solid-content ratio)] (product name "Darocur 1173", manufactured by BASF, solid-content concentration: 100% by mass) serving as (D) a photopolymerization initiator.

Subsequently, the solution of a film-forming composition thus prepared was applied onto a release film (product name "SP-PET3811", manufactured by LINTEC Corporation, thickness: 38 μm, hereinafter referred to also as "release film 1") formed of poly(ethylene terephthalate) (PET) film, in accordance with a fountain die system such that the resultant cured film had a thickness of 150 μm, to form a coating film.

The coating film was irradiated with ultraviolet rays from the coating film side to form a semi-cured layer. It is to be noted that ultraviolet ray irradiation was performed using a belt conveyer system ultraviolet irradiation apparatus (product name: "ECS-401GX", manufactured by EYE GRAPHICS Co., Ltd.) as an ultraviolet ray irradiation apparatus, and a high pressure mercury lamp (H04-L41, manufactured by EYE GRAPHICS Co., Ltd.: H04-L41) as an ultraviolet ray source, in the irradiation conditions: height of a lamp: 150 mm, power of the lamp: 3 kW (power converted: 120 mW/cm), wavelength of the light beam: 365 nm, illuminance: 271 mW/cm$^2$, irradiation amount: 177 mJ/cm$^2$ (measured by an ultraviolet ray quantity meter "UV-351", manufactured by ORC MANUFACTURING CO., LTD.).

On the semi-cured layer thus formed, a PET film having a thickness of 100 μm was laminated as a substrate. Ultraviolet rays was irradiated from the side of the PET film laminated four times by using the aforementioned ultraviolet irradiation apparatus and ultraviolet ray source in the irradiation conditions: height of a lamp: 150 mm, power of the lamp: 3 kW (power converted: 120 mW/cm), wavelength of the light beam: 365 nm, illuminance: 271 mW/cm$^2$, irradiation amount: 1200 mJ/cm$^2$ (measured by an ultraviolet ray quantity meter "UV-351", manufactured by ORC MANUFACTURING CO., LTD.) to completely cure the semi-cured layer. In this manner, an unevenness-absorbing layer of 150 μm in thickness on the PET film serving as a substrate was formed.

Then, release film 1 on the unevenness-absorbing layer was removed and the unevenness-absorbing layer exposed was stuck to the pressure sensitive adhesive layer of the pressure sensitive adhesive sheet manufactured in Production Example 1, and unnecessary portions at the edges in the width direction were cut away to manufacture a BG sheet (sheet size: 330 mm in width and 200 m in length, the substrate, unevenness-absorbing layer, pressure sensitive adhesive layer and release film 2 had the same width) stuck to the adhesive sheet of Production Example 1.

Example 2

A BG sheet stuck to the pressure sensitive adhesive sheet manufactured in Production Example 1 was manufactured in the same manner as in Example 1 except that the content of the component (C) in the film-forming composition of Example 1 was changed to 4.0 parts by mass.

Example 3

A BG sheet stuck to the pressure sensitive adhesive sheet manufactured in Production Example 1 was manufactured in the same manner as in Example 1 except that the content of the component (C) in the film-forming composition of Example 1 was changed to 4.5 parts by mass.

Example 4

A BG sheet stuck to the pressure sensitive adhesive sheet manufactured in Production Example 1 was manufactured in the same manner as in Example 1 except that the content of the component (C) in the film-forming composition of Example 1 was changed to 1.5 part by mass.

Comparative Example 1

There was used a BG sheet (manufactured by Mitsui Chemicals Tohcello, Inc.) manufactured by laminating an unevenness-absorbing layer formed of an ethylene-α-olefin copolymer of 300 μm in thickness on a substrate formed of a polyester-based film of 50 μm in thickness, and further, providing a pressure sensitive adhesive layer of 40 μm in thickness on the unevenness-absorbing layer.

Comparative Example 2

A BG sheet stuck to the pressure sensitive adhesive sheet manufactured in Production Example 1 was manufactured in the same manner as in Example 1 except that the content of IBXA [component (B)] was changed to 54 parts by mass; the content of HPA [component (B)] was changed to 6 parts by mass; and the content of the component (C) was changed to 4.0 parts by mass from the film-forming composition of Example 1.

Comparative Example 3

A BG sheet stuck to the adhesive sheet manufactured in Production Example 1 was manufactured in the same manner as in Example 1 except that the content of IBXA (component (B)) was changed to 30 parts by mass; the content of HPA (component (B)) was changed to 30 parts by mass; and the content of the component (C) was changed to 4.0 parts by mass from the film-forming composition of Example 1.

Comparative Example 4

A BG sheet stuck to the adhesive sheet manufactured in Production Example 1 was manufactured in the same manner as in Example 1 except that the content of the component (C) of the film-forming composition of Example 1 was changed to 5.0 parts by mass.

Physical properties in the unevenness-absorbing layers constituting BG sheets manufactured in Examples and Comparative Examples were measured, and the BG sheets were evaluated based on the aforementioned methods. The results are shown in Table 1.

TABLE 1

| | Physical properties in unevenness-absorbing layer | | | Formulation of film-forming composition [parts by mass (solid-content ratio)] | | | | Evaluation of BG sheet | | |
|---|---|---|---|---|---|---|---|---|---|---|
| | Requirement (a) Loss tangent at 70° C. measured at a frequency of 1 Hz [—] | Requirement (b) Relaxation rate 300 seconds after a square (1 cm × 1 cm) of the unevenness-absorbing layer is compressed at 25° C. and a compressive load of 10 N [%] | Requirement (c) Storage elastic modulus at 25° C. measured at a frequency of 1 Hz [MPa] | Component (A) Mixture of monofunctional urethane (meth)acrylate and bifunctional urethane (meth)acrylate | Component (B) IBXA | HPA | Component (C) PE1 (*1) | Difference in height [μm] | Absorptivity of uneven portions (bumps etc.) | Presence or absence of oozing in the unevenness-absorbing layer when a BG sheet is wound up in the form of roll |
| Example 1 | 2.3 | 28 | 5.2 | 40 | 45 | 15 | 3.5 | 3.6 | A | A |
| Example 2 | 2.8 | 22 | 6.6 | 40 | 45 | 15 | 4.0 | 3.8 | A | A |
| Example 3 | 3.5 | 24 | 1.3 | 40 | 45 | 15 | 4.5 | 4.1 | A | A |
| Example 4 | 1.67 | 26.8 | 2.69 | 40 | 45 | 15 | 1.5 | 9.3 | A | A |
| Comparative Example 1 | 0.8 | 7 | 0.8 | Ethylene-α-olefin copolymer (*2) | | | | 5.8 | F | — (*3) |
| Comparative Example 2 | 1.7 | 32 | 11.3 | 40 | 54 | 6 | 4.0 | 12.5 | F | B |

TABLE 1-continued

| | Physical properties in unevenness-absorbing layer | | | Formulation of film-forming composition [parts by mass (solid-content ratio)] | | | | Evaluation of BG sheet | | |
|---|---|---|---|---|---|---|---|---|---|---|
| | Requirement (a) Loss tangent at 70° C. measured at a frequency of 1 Hz [—] | Requirement (b) Relaxation rate 300 seconds after a square (1 cm × 1 cm) of the unevenness-absorbing layer is compressed at 25° C. and a compressive load of 10 N [%] | Requirement (c) Storage elastic modulus at 25° C. measured at a frequency of 1 Hz [MPa] | Component (A) Mixture of mono-functional urethane (meth)acrylate and bifunctional urethane (meth)acrylate | Component (B) IBXA | HPA | Component (C) PE1 (*1) | Difference in height [μm] | Absorptivity of uneven portions (bumps etc.) | Presence or absence of oozing in the unevenness-absorbing layer when a BG sheet is wound up in the form of roll |
| Comparative Example 3 | 2.6 | 10 | 0.4 | 40 | 30 | 30 | 4.0 | 6.2 | A | C |
| Comparative Example 4 | 4.6 | 31 | 1.3 | 40 | 45 | 15 | 5.0 | 5.9 | A | C |

(*1): Pentaerythritol tetrakis(3-mercaptobutyrate) (product name "Karenz MT (registered trade mark) PE1", manufactured by Showa Denko K.K.)
(*2): Constitution material for unevenness-absorbing layer of BG sheet manufactured by Mitsui Chemicals Tohcello, Inc.
(*3): Since the BG sheet of Comparative Example 1 failed to be wound up in the form of roll in the same conditions as in Examples, evaluation was not made.

According to Table 1, it is found that the difference in height of BG sheets of Examples 1 to 4 is suppressed to be low compared to the BG sheets of Comparative Examples 1 to 4; and the absorptivity of uneven portions (bumps etc.) is excellent compared to the BG sheets of Comparative Examples. In addition, oozing in the unevenness-absorbing layer was not observed when being wound up in the form of roll.

In contrast, in Comparative Example 1, since the unevenness-absorbing layer constituting the BG sheet failed to satisfy the requirement (a), with the result that absorptivity of uneven portions (bumps etc.) was poor.

In each of Comparative Examples 2 and 4, since the unevenness-absorbing layer constituting the BG sheet failed to satisfy the requirement (b), oozing in the unevenness-absorbing layer when being wound up in the form of roll was observed. In addition, in the BG sheet of Comparative Example 2, the unevenness-absorbing layer failed to satisfy the requirement (c) and the storage elastic modulus at 25° C. was extremely large, with the result that difference in height was large and absorptivity of uneven portions (bumps etc.) was poor.

In Comparative Example 3, since the unevenness-absorbing layer constituting the BG sheet failed to satisfy the requirement (c) and the storage elastic modulus at 25° C. was extremely small, oozing in the unevenness-absorbing layer was observed when being wound up in the form of roll.

INDUSTRIAL APPLICABILITY

The BG sheet of the present invention has excellent absorptivity of uneven portions (bumps etc.) in a semiconductor wafer. Thus, it is possible to sufficiently prevent, in particular, formation of gaps between bumps and the BG sheet, and simultaneously suppress occurrence of oozing in the unevenness-absorbing layer from the edges of the sheet, when being wound up in the form of roll.

For the reason, the BG sheet of the present invention is suitable as a surface protecting sheet for protecting the uneven portions by sticking it to uneven portions (bumps etc.) of a semiconductor wafer, in grinding the back surface of the semiconductor wafer having bumps.

EXPLANATIONS OF LETTERS OR NUMERALS 1a, 1b, 1c BG sheet (back grinding sheet)
11 Substrate
12 Unevenness-absorbing layer
13 Pressure sensitive adhesive layer
14 Release material

The invention claimed is:

1. A back grinding sheet, comprising an unevenness-absorbing layer on a substrate,
wherein:
the unevenness-absorbing layer is a layer formed of a film-forming composition comprising
(A) a urethane (meth) acrylate present in an amount of 33% by mass or more, based on a total mass of the film-forming composition,
(B) a polymerizable monomer not including the urethane (meth)acrylate (A), and
(C) a thiol group-containing compound; and the unevenness-absorbing layer satisfies the following requirements (a) to (c)
(a) a loss tangent at 70° C. measured at a frequency of 1 Hz is 1.5 or more,
(b) a relaxation rate 300 seconds after a square (1 cm×1 cm) of the unevenness-absorbing layer is compressed at 25° C. and a compressive load of 10N is 30% or less, and
(c) a storage elastic modulus at 25° C. measured at a frequency of 1 Hz is 1.0 to 10.0 MPa.

2. The back grinding sheet according to claim 1, wherein the polymerizable monomer (B) comprises a (meth)acrylate having an alicyclic structure.

3. The back grinding sheet according to claim 1, wherein the urethane (meth)acrylate (A) comprises a mono-functional urethane (meth)acryl ate oligomer.

4. The back grinding sheet according to claim 1, further comprising a pressure sensitive adhesive layer on the unevenness-absorbing layer.

5. The back grinding sheet according to claim 1, which is stuck to uneven portions of a semiconductor wafer.

6. The back grinding sheet according to claim 1, wherein a weight average molecular weight of the urethane (meth) acrylate (A) range from 1,000 to 100,000.

7. The back grinding sheet according to claim 1, wherein a content of the thiol group-containing compound is 1.0 to 4.9 parts by mass, relative to a total content (100 parts by mass) of the urethane (meth)acrylate (A) and the polymerizable monomer (B).

8. The back grinding sheet according to claim 1, wherein a mass ratio of the urethane (meth)acrylate (A) to the polymerizable monomer (B) [component (A)/component (B)] range from 35/65 to 60/40.

* * * * *